(12) United States Patent
Hiwatari et al.

(10) Patent No.: US 8,790,525 B2
(45) Date of Patent: Jul. 29, 2014

(54) METHOD OF MANUFACTURING MAGNETIC RECORDING MEDIUM, AND MAGNETIC RECORDING AND REPRODUCING DEVICE

(71) Applicant: Showa Denko K.K., Tokyo (JP)

(72) Inventors: Makoto Hiwatari, Chiba (JP); Akira Yamane, Ichihara (JP); Tomoo Shige, Chiba (JP); Akira Sakawaki, Kisarazu (JP)

(73) Assignee: Showa Denko K.K., Tokyo (JP)

( * ) Notice: Subject to any disclaimer, the term of this patent is extended or adjusted under 35 U.S.C. 154(b) by 1 day.

(21) Appl. No.: 13/742,657

(22) Filed: Jan. 16, 2013

(65) Prior Publication Data

US 2013/0188278 A1    Jul. 25, 2013

(30) Foreign Application Priority Data

Jan. 20, 2012  (JP) ................. 2012-010399

(51) Int. Cl.
  *B44C 1/22*    (2006.01)
  *G11B 5/84*    (2006.01)
  *G11B 5/855*   (2006.01)
  *G11B 5/31*    (2006.01)
  *H01L 21/311*  (2006.01)

(52) U.S. Cl.
  CPC  *G11B 5/84* (2013.01); *G11B 5/855* (2013.01); *G11B 5/3163* (2013.01); *G11B 5/3116* (2013.01); *H01L 21/31116* (2013.01)
  USPC ............. 216/22; 216/41; 216/67; 29/603.15; 29/603.16

(58) Field of Classification Search
  CPC ........ G11B 5/84; G11B 5/855; G11B 5/3116; G11B 5/3163; H01L 21/3116
  USPC ................. 216/22, 41, 67; 29/603.15, 603.16
  See application file for complete search history.

(56) References Cited

U.S. PATENT DOCUMENTS

| | | | |
|---|---|---|---|
| 2006/0038246 A1* | 2/2006 | Maehara et al. | 257/421 |
| 2011/0272380 A1* | 11/2011 | Jeong et al. | 216/22 |
| 2011/0309050 A1* | 12/2011 | Iori et al. | 216/67 |
| 2012/0103933 A1* | 5/2012 | Yamada et al. | 216/22 |

FOREIGN PATENT DOCUMENTS

JP    2004-164692 A    6/2004

\* cited by examiner

*Primary Examiner* — Shamim Ahmed
(74) *Attorney, Agent, or Firm* — Sughrue Mion, PLLC

(57) ABSTRACT

A method of manufacturing a magnetic recording medium is provided. The method includes: forming a magnetic layer 2 on a non-magnetic substrate 1; forming a mask layer 3 on the magnetic layer 2; forming a resist layer 4 which is patterned into a predetermined shape on the mask layer 3; patterning the mask layer 3 into a shape corresponding to the resist layer 4 using the resist layer 4; patterning the magnetic layer 2 into a shape corresponding to the mask layer 3 using the patterned mask layer 3; and removing the mask layer 3 that remains on the magnetic layer 2 by reactive plasma etching. The reactive plasma etching is performed under an atmosphere containing an organic compound having at least one kind or plural kinds of functional groups selected from a hydroxyl group, a carbonyl group, a hydroxy carbonyl group, an alkoxy group, and an ether group.

6 Claims, 2 Drawing Sheets

METHOD OF MANUFACTURING MAGNETIC RECORDING MEDIUM, AND MAGNETIC RECORDING AND REPRODUCING DEVICE

BACKGROUND OF THE INVENTION

1. Field of the Invention

The present invention relates to a method of manufacturing a magnetic recording medium that is used in a hard disk device (HDD) or the like, and a magnetic recording and reproducing device.

Priority is claimed on Japanese Patent Application No. 2012-010399, filed on Jan. 20, 2012, the content of which is incorporated herein by reference.

2. Description of Related Art

In recent years, an application range of a magnetic recording device such as a magnetic disk device, a flexible disk device, and a magnetic tape device has been widely used, the importance thereof has been increased, and recording density of a magnetic recording medium that is used in these devices has been significantly improved. Particularly, since an MR head or a PRML technology was introduced, surface recording density has been significantly increased. In recent years, a GMR head, a TMR head, or the like has been introduced, and thus the surface recording density has been increased at a rate of approximately 1.5 times per year.

With respect to the magnetic recording medium, there has been a need for further higher recording density to be achieved. Therefore, there has been a need to achieve a high coercive force of a magnetic layer, a high signal-to-noise ratio (SNR), and high resolution. In recent years, an attempt at improving linear recording density and surface recording density by increasing track density has been made.

In recent magnetic recording devices, track density thereof reaches 400 kTPI. However, when the track density in the magnetic recording device is increased, plural pieces of magnetically recorded information between adjacent tracks interfere with each other, and a magnetic transition region of a boundary region becomes a noise source. Accordingly, there is a problem in that SNR deteriorates. This leads to deterioration of a bit error rate (BER), and thus improvement of recording density is hindered.

It is necessary to ensure as large a magnetic saturation as possible in each recording bit and a large magnetic film thickness by making the size of each recording bit on a magnetic recording medium relatively minute so as to increase the surface recording density. On the other hand, when the recording bit is made minute, there is a problem in that the minimum magnetic volume per bit decreases, and thus recorded data may be missed due to magnetic inversion caused by thermal fluctuation.

For example, when the recording density of the magnetic recording medium becomes 2 Tbpsi, an area occupied by one bit is a maximum of 322 $nm^2$ (an equivalent circle diameter of approximately 18 nm), and when considering a mutual operation between adjacent bits, an effective area is narrowed to 193 $nm^2$ (an equivalent circle diameter of approximately 14 nm). With this area, when it is attempted to ensure a particle size capable of maintaining thermally stable data, it is difficult to ensure the number of magnetic particles for maintaining SNR necessary for the magnetic recording device. On the other hand, when the magnetic particles are made minute in order to maintain a SNR of the magnetic recording device, it is difficult to maintain the magnetic data that is recorded due to thermal instability caused by a decrease in volume per magnetic particle.

In addition, in the magnetic recording device, when the track density is increased, a distance between tracks decreases, and thus a track servo technology with a significantly high accuracy is necessary. Therefore, in the magnetic recording and reproducing device, a method is generally used in which data is recorded with a large width and the data is read in a width narrower than during the recording of the data in order to exclude an effect from an adjacent track during reproduction as much as possible. However, in this method, it is possible to suppress the effect between tracks as much as possible, but it is difficult to obtain a sufficient reproduction output. As a result, there is a problem in that it is difficult to ensure a sufficient SNR.

As one method of solving the problem of the above-described thermal fluctuation, and ensuring a good SNR to achieve a sufficient output, an attempt has been made to increase the track density by forming an irregularity along a track on a surface of the magnetic recording medium to physically separate recording tracks from each other (for example, refer to Japanese Unexamined Patent Application, First Publication No. 2004-164692). This technology is generally called a discrete track method. In addition, a magnetic recording medium having a magnetically separated track pattern is called a discrete track medium.

In addition, in order to realize further higher recording density of the magnetic recording medium, a magnetic recording medium is suggested in which an irregularity is also formed for each bit with respect to a longitudinal direction (a circumferential direction) of a track to physically separate magnetic particles from each other and to perform recording with one magnetic particle set as one bit. This magnetic recording medium having a pattern in which both of the spaces between tracks and between bits are magnetically separated is called a bit-patterned medium.

In the bit-patterned medium, when both of the spaces between tracks and between bits are magnetically separated, a magnetic mutual operation that occurs therebetween may be suppressed. Accordingly, stability of recorded data on the magnetic recording medium may increase. In addition, since one bit is constructed by a single magnetic particle, a transition noise caused by a boundary disturbance is suppressed, and thus SNR is improved. As a result, a relatively dense magnetic recording may be realized.

However, when manufacturing a so-called patterned medium such as the above-described discrete track medium and bit-patterned medium, a mask layer having a shape corresponding to magnetic recording patterns is formed on a magnetic layer, and then the magnetic layer is etched by using the mask layer to pattern the magnetic layer to have a shape corresponding to the magnetic recording patterns. Furthermore, a non-magnetic layer is embedded in a portion, at which the magnetic layer is removed, for planarization of a surface of the magnetic recording medium, and then an excess non-magnetic layer and the mask layer are removed.

However, in the method of manufacturing the patterned medium in the related art, the magnetic layer is subjected to a physical irregularity process by using the mask layer, and then the mask layer that becomes unnecessary is removed from the upper side of the magnetic layer by using dry etching or wet etching. At this point, there is a problem in that oxidization or dissolution of the magnetic layer occurs, and thus the magnetic characteristics deteriorate. Therefore, a method of removing the mask layer which is capable of suppressing magnetic damage on the magnetic layer has been required.

The invention has been made in consideration of the above-described circumstances in the related art and an object thereof is to provide a method of manufacturing a magnetic recording medium which is capable of manufacturing a magnetic recording medium that has excellent magnetic separation performance of magnetic recording patterns by removing a mask layer formed on the magnetic layer without causing magnetic damage to the magnetic layer with high productivity, and a magnetic recording and reproducing device that uses the magnetic recording medium manufactured by the method and that is capable of further improving electromagnetic conversion characteristics.

SUMMARY OF THE INVENTION

That is, the invention provides a method of manufacturing a magnetic recording medium and a magnetic recording and reproducing device to be described below.

(1) According to a first aspect of the invention, a method of manufacturing a magnetic recording medium is provided, including: forming a magnetic layer on a non-magnetic substrate; forming a mask layer on the magnetic layer; forming a resist layer which is patterned into a predetermined shape on the mask layer; patterning the mask layer into a shape corresponding to the resist layer using the resist layer; patterning the magnetic layer into a shape corresponding to the mask layer using the patterned mask layer; and removing the mask layer that remains on the magnetic layer by reactive plasma etching. The reactive plasma etching is performed in an atmosphere containing an organic compound having at least one kind or plural kinds of functional groups selected from a hydroxyl group, a carbonyl group, a hydroxy carbonyl group, an alkoxy group, and an ether group.

(2) In the method of manufacturing a magnetic recording medium according to (1), the mask layer may be a carbon film.

(3) In the method of manufacturing a magnetic recording medium according to (1), the mask layer may be formed from a metallic film of at least one kind selected from Ni, Fe, Co, and Cr, or an alloy film containing plural kinds thereof.

(4) In the method of manufacturing a magnetic recording medium according to (1), the mask layer may be formed from a resin film.

(5) In the method of manufacturing a magnetic recording medium according to (1), the mask layer may be formed from a laminated film in which a first layer formed from any one selected from a carbon film, a metallic film or an alloy film, and a resin film, and a second layer formed from a material having an etching rate lower than an etching rate of the first layer are laminated in this order.

(6) In the method of manufacturing a magnetic recording medium according to (5), the second layer may be formed from a metallic film of at least one kind selected from Si, Al, Cr, Cu, Mo, W, Pt, Au, Ta, Ni, Fe, and Co, or an alloy film containing plural kinds thereof.

(7) According to a second aspect of the invention, a magnetic recording and reproducing device is provided, including: a magnetic recording medium that is manufactured by the method according to any one of (1) to (6); a medium-driving unit that drives the magnetic recording medium in a recording direction; a magnetic head that performs a recording operation and a reproducing operation with respect to the magnetic recording medium; a head-moving unit that allows the magnetic head to relatively move with respect to the magnetic recording medium; and a recording and reproducing signal-processing unit that performs signal input to the magnetic head and reproduction of an output signal from the magnetic head.

According to the method of manufacturing a magnetic recording medium of the invention, the mask layer which remains on the magnetic layer may be removed without causing magnetic damage to the magnetic layer. Therefore, according to the invention, a magnetic recording medium which has excellent magnetic separation performance of magnetic recording patterns may be manufactured with high productivity. Furthermore, in a magnetic recording and reproducing device that uses the magnetic recording medium manufactured by the method of the invention, electromagnetic conversion characteristics may be further improved.

DETAILED DESCRIPTION OF THE INVENTION

Figure 1A:
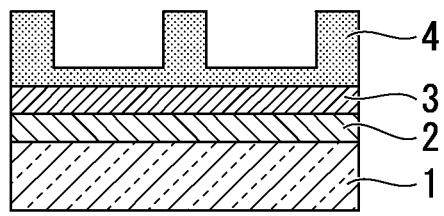
FIG. 1A is a cross-sectional diagram illustrating a method of manufacturing a magnetic recording medium to which the invention is applied.

Hereinafter, embodiments of a method of manufacturing a magnetic recording medium and a magnetic recording and reproducing device related to the invention will be described in detail with reference to the attached drawings.

In addition, in the drawings that are used in the following description, characteristic portions may be indicated in an enlarged manner for convenience so as to easily understand the characteristics of the invention, and a dimensional ratio of each constituent element or the like is not intended to limit the dimensional ratio in the actual magnetic recording medium and magnetic recording and reproducing device.

Method of Manufacturing Magnetic Recording Medium

First, a method of manufacturing a magnetic recording medium to which the invention is applied will be described.

The invention relates to a method of manufacturing a magnetic recording medium having magnetic recording patterns that are magnetically separated. When manufacturing the magnetic recording medium, first, as shown in FIG. 1A, a magnetic layer 2, a mask layer 3, and a resist layer 4 are sequentially laminated on a non-magnetic substrate 1.

In addition, the resist layer 4 is patterned into a shape corresponding to magnetic recording patterns of the magnetic layer 2 using, for example, a photolithography method, a nano-imprinting method, or the like.

Specifically, when patterning the resist layer 4, the nano-imprinting method is preferably used. As a nano-imprinting method, methods such as a thermal imprinting method, an ultraviolet (UV) imprinting method, and a compression imprinting method may be used. Among these, the UV imprinting method in which a pattern is transferred on to the resist layer 4 formed from a material that is cured by irradiation of ultraviolet (UV) light by using a stamp (not shown) is convenient.

As a method of irradiating the resist layer 4 with radiation in a state such that a stamp is compressed on to the resist layer 4, for example, a method of irradiating the resist layer 4 with radiation from an opposed side of the stamp, that is, from the non-magnetic substrate 1 side, a method in which a material capable of transmitting radiation is selected as a material of the stamp, and the resist layer 4 is irradiated with radiation from the stamp side, a method of irradiating the resist layer 4 with radiation from a side surface of the stamp, or the like may be used.

In addition, the ultraviolet light described in the invention represents light such as near ultraviolet light, ultraviolet light, vacuum ultraviolet light, and the like that have a wavelength less than 400 nm. In addition, examples of materials that are cured when being irradiated with ultraviolet light include an ultraviolet-curable resin.

In addition, particularly, among these materials, it is preferable that an ultraviolet-curable resin such as a novolac-based resin, an acrylic ester resin, and an alicyclic epoxy be used as the resist layer 4, and glass or a resin that has high transmittance with respect to an ultraviolet ray be used as the stamp material.

In addition, in a case of using the thermal imprinting method, a thermoplastic resin or a thermosetting resin may be used. Among these, in a case where the thermoplastic resin is used as the resist layer 4, a stamper may be compressed on to the resist layer 4 after the resist layer 4 is heated in advance to have fluidity, and then the stamper may be peeled off after the resist layer 4 is cooled. On the other hand, in a case of using the thermosetting resin as the resist layer 4, the resist layer 4 may be heated while being compressed with the stamper, and the stamper may be peeled off after the resin is cured.

In addition, in a case of using the compression imprinting method, as a material showing plastic deformation with respect to a pressure under room temperature, for example, glass, metallic glass, a siloxane resin, or the like may be used. In addition, when these materials are used as the resist layer 4, the resist layer 4 may be compressed by a stamper at room temperature, and then the stamper may be peeled off.

In addition, in the invention, after a process of transferring the pattern, the resist layer 4 may be irradiated with relatively strong ultraviolet light or radiation. Due to this process, a cure degree of the resist layer 4 increases, and thus a pattern shape (a rectangle characteristic) of the magnetic layer after being subjected to the subsequent processes may be improved.

In the process of transferring a pattern, as the stamper, for example, a stamper having a minute track pattern formed in a metallic plate by using a method such as electron beam lithography may be used. In addition, it is required for the stamper to have a hardness and durability capable of enduring the above-described process, for example, Ni or the like is used for the stamper. However, a material of the stamper is not limited so far as the material meets with the requirement above. Furthermore, in addition to a track on which normal data is recorded, a pattern of a servo signal such as a burst pattern, a gray code pattern, and a preamble pattern may be also formed in the stamp.

Figure 1B:
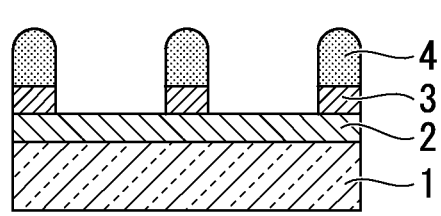
FIG. 1B is a cross-sectional diagram illustrating the method of manufacturing a magnetic recording medium to which the invention is applied.

Next, as shown in FIG. 1B, the mask layer 3 is patterned into a shape corresponding to the magnetic recording patterns using the resist layer 4.

Specifically, when patterning the mask layer 3, anisotropic dry etching, for example, ion milling, directivity-incremented reactive etching, or the like is used. According to this, a portion of the mask layer 3 such as a groove (concave) covered with the resist layer 4 in a relatively small thickness is partially removed in accordance with the pattern formed in the resist layer 4 until a surface of the magnetic layer 2 is exposed. According to this removal, the mask layer 3 may be patterned into a shape corresponding to the resist layer 4, that is, a shape corresponding to a pattern of a magnetic recording portion of the magnetic layer 2.

In addition, the resist layer 4 is removed with the process of the etching from an upper side of the mask layer 3. However, since a shape of the resist layer 4 is transferred on to the mask layer 3 as is, the mask layer 3 may be patterned into a shape corresponding to the resist layer 4. Therefore, even when the resist layer 4 remains on the mask layer 3 or is completely removed from the upper side of the mask layer 3 at a time when the patterning of the mask layer 3 is completed.

Figure 1C:
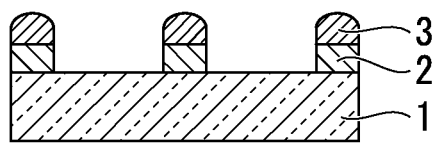
FIG. 1C is a cross-sectional diagram illustrating the method of manufacturing a magnetic recording medium to which the invention is applied.

Next, as shown in FIG. 1C, the magnetic layer 2 is patterned into a shape corresponding to the mask layer 3 using the patterned mask layer 3. Specifically, a surface of the magnetic layer 2 on which the patterned mask layer 3 is formed is irradiated with an ion beam to etch and remove a portion of the magnetic layer 2 which is not covered with the mask layer 3.

Figure 1D:
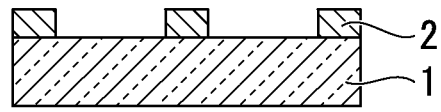
FIG. 1D is a cross-sectional diagram illustrating the method of manufacturing a magnetic recording medium to which the invention is applied.

Next, as shown in FIG. 1D, the mask layer 3 that remains on the magnetic layer 2 is removed by reactive plasma etching. Specifically, in the invention, the reactive plasma etching is performed under an atmosphere containing an organic compound having at least one kind or plural kinds of functional groups selected from a hydroxyl group, a carbonyl group, a hydroxy carbonyl group, an alkoxy group, and an ether group.

In the invention, it is preferable to use a material which is removed by a reactive plasma etching operation for the mask layer 3 so as to realize the etching process. For example, a carbon (C) film, a resin film, a metallic film of at least one kind selected from nickel (Ni), iron (Fe), cobalt (Co), and chrome (Cr), an alloy film containing plural kinds thereof, or the like may be used for the mask layer 3.

Among these, a low-density carbon such as sputtered carbon or a high-density carbon such as diamond-like carbon (DLC) formed by a CVD method may be used for the C film. Furthermore, this may be used as a single layer or a plural-laminated layer.

On the other hand, it is preferable to use a resin material not containing a metal-based element for the resin film. In addition to a general resin material such as an epoxy-based resin, an acryl-based resin, and a novolac-based resin, for example, a resist material such as an ultraviolet-curable resin may be used.

Also, in addition to a NiFe alloy (81Ni-19Fe, 80Ni-18Fe-2Co, or the like) represented by Permalloy, CoFe, CoNi, NiFeCo, FeC, CoCr, CrNi, or the like may be used for the alloy film.

In addition, a laminated film may be used for the mask layer 3. In the laminated film, a first layer formed from any one selected from the C film, the resin film, and the metallic film or an alloy film, and a second layer formed from a material having an etching rate lower than that of an etching rate of the first layer are laminated in this order.

In the laminated film constituting the mask layer 3, for example, in a case where the C film or the resin film is used for the first layer, it is preferable to use a metallic material which has a low etching rate with respect to oxygen plasma etching and can be etched by reactive etching excluding oxygen or argon milling as the second layer.

For example, in this case, a metallic film of at least one kind selected from Si, Al, Cr, Cu, Mo, W, Pt, Au, Ta, Ni, Fe, and Co, or an alloy film containing plural kinds thereof may be appropriately used for the second layer. In addition, for example, AlSi, CrCu, CrW, AlW, NiW, or the like may be appropriately used for the alloy film.

Particularly, in a case where a laminated film, in which a laminated film of the carbon film and the DLC film as the first layer, and the Si film as the second layer are laminated in this order, is used as the mask layer 3, shape processability with respect to the magnetic layer 2 may be increased.

On the other hand, in a case where the metallic film or the alloy film is used for the first layer, it is preferable to use a metallic material which has a low etching rate with respect to reactive etching of carbon monoxide and can be etched by reactive etching excluding carbon monoxide or argon milling as the second layer.

For example, in this case, a metallic film of at least one kind selected from Si, Al, Cu, Mo, W, Ta, Pt, and Au, or an alloy film containing plural kinds thereof may be appropriately used for the second layer. In addition, for example, AlSi, AgCu, TiW, TiV, AlW, or the like may be appropriately used for the alloy film.

It is preferable that the second layer have a thickness of 3 nm or less after etching the magnetic layer 2, and it is more preferable that the second layer be removed during the etching of magnetic layer 2. In addition, it is preferable that the thickness of the second layer be smaller than that of the magnetic layer 2.

For example, in a case where an etching depth of the magnetic layer 2 is 10 nm, it is preferable that the thickness of the second layer be 10 nm or less. In this case, since the second layer is removed during formation of the pattern on the magnetic layer 2, it is easy to peel off the first layer.

On the other hand, in a case where the alloy film selected from Ni, Fe, and Co is used as the second layer, since peeling off a layer according to the invention is easy, the thickness is not limited.

In addition, in the above-described mask layer 3, when a laminated film in which the C film or the resin film, and the metallic film are laminated is set as one set (stage), and plural sets (stages) of this laminated film are laminated, processing accuracy of the magnetic layer 2 or shape processability such as a rectangular characteristic, may be relatively increased. Particularly, when using a configuration in which a carbon film, a DLC film, a Ni film, a carbon film, and a silicon film are laminated in this order, or a configuration in which a DLC film, a carbon film, a DLC film, a Si film, a Ni film, a carbon film, and a silicon film are laminated in this order, a satisfactory shape processability with respect to the magnetic layer 2 may be obtained.

In regard to the reactive plasma etching of the invention, it is necessary to remove the mask layer 3 without causing magnetic damage to the magnetic layer 2. Therefore, in the invention, the reactive plasma etching is performed under an atmosphere containing an organic compound having at least one kind or plural kinds of functional groups selected from a hydroxyl group, a carbonyl group, a hydroxy carbonyl group, an alkoxy group, and an ether group.

That is, in the invention, the etching is performed under a reactive plasma atmosphere containing a hydrocarbon ion, a carbonyl ion, a hydrogen ion, and a hydroxyl ion that may become a radical, a free radical, and the like.

For example, in a case where the C film or the resin film is used for the mask layer 3, a hydrocarbon ion, a carbonyl ion, a hydrogen ion, a hydroxyl ion, a radical thereof, and the like are effective as reactive species.

In addition, in a case where the C film, the resin film, the metallic film of at least one kind selected from Ni, Fe, Co, and Cr, or an alloy film containing plural kinds thereof is used for the mask layer 3, the carbonyl ion and a radical thereof are effective as the reactive species.

In this case, an ion and a radical of hydrocarbon, carbonyl, hydroxyl, hydrogen, alkoxyl, and the like are removed by the reactive etching of the mask layer 3. However, among these, the ion and the radical of the carbonyl, hydroxyl, and alkoxyl act on a surface of the magnetic layer 2, and thus cause magnetic damage thereto due to oxidization or etching. Conversely, the ions and the radicals of hydrocarbon and hydrogen have an effect of suppressing oxidization of the magnetic layer 2, and an effect of further reducing the magnetic layer that is oxidized. Therefore, in the invention, due to these effects, the mask layer 3 may be removed without causing magnetic damage to the magnetic layer 2.

In addition, as a method of allowing an hydrocarbon ion, a hydrogen ion, a carbonyl ion, a hydroxyl ion, an alkoxyl ion, and radicals thereof to coexist under a reactive plasma atmosphere, there is a method of using a material that is gasified from an organic compound such as alcohol, ketone, ether, a carboxylic acid.

In addition, examples of this material include methanol, ethanol, propanol, ethylene glycol, glycerin, phenol, acetone, 2-butanone, cyclohexanone, acetyl acetone, formaldehyde, acetaldehyde, a formic acid, an acetic acid, a propionic acid, an oxalic acid, ethyl acetate ester, butyl acetate ester, diethyl ether, tetrahydrofuran, methoxy benzene, anisole, propylene glycol monomethyl ether, and the like.

In addition, since these raw materials are gasified, it is preferable that these materials be present as liquid at normal temperature. In addition, a method of warming a gas container and a gas supply system may be used.

Furthermore, a small amount of inert gas such as argon (Ar) and krypton (Kr) may be mixed with the raw materials so as to stabilize plasma. In addition, helium (He), argon (Ar), hydrogen ($H_2$), or a hydrogen carbide gas such as methane ($CH_4$) and ethylene ($C_2H_4$) may be used as a carrier gas to stabilize supply of a raw material gas.

In addition, the above-described carbonyl ion, hydroxyl ion, alkoxyl ion, hydrogen ion, and radicals thereof have an effect of removing (gasifying) the resist layer 4 that remains on the surface of the mask layer 3. That is, since the resist layer 4 generally includes a large amount of organic material, and has a density lower than that of the carbon film that is used as the mask, the resist layer 4 may be easily removed by the ions or radicals thereof.

Figure 1E:
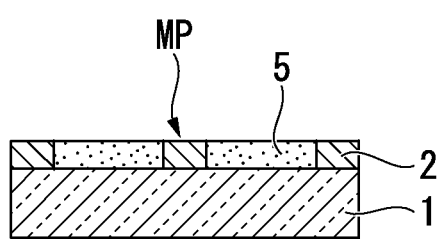
FIG. 1E is a cross-sectional diagram illustrating the method of manufacturing a magnetic recording medium to which the invention is applied.

Next, as shown in FIG. 1E, after patterning the magnetic layer 2, a non-magnetic layer 5 is embedded in an irregularity formed on the surface of the magnetic layer 2. Specifically, for example, a metal such as Cr, Ru, Ti, W, Ta, Mo, and alloys including CoCr and TiAl, an oxide such as a Si oxide, a Cr oxide, a Ti oxide, a W oxide, a Co oxide, a Ta oxide, and a Ru oxide may be used for the non-magnetic layer 5. In addition, when forming a film of the non-magnetic layer 5, for example, a sputtering method may be appropriately used.

In addition, after the non-magnetic layer 5 having a sufficient thickness to be embedded in the irregularity of the magnetic layer 2 is formed, planarization is performed until the surface of the magnetic layer 2 is exposed. According to this, magnetic recording patterns MP (magnetic layer 2) may be exposed between portions of the non-magnetic layer 5. In addition, in regard to a planarization processing method, ion milling may be exemplified as a dry method, and polishing by CMP (Chemical Mechanical Polishing) may be exemplified as a wet method. In the invention, either the ion milling or the polishing by CMP may be appropriately used.

On the other hand, in the invention, it is not necessary to perform the planarization processing using the non-magnetic layer 5 as shown in FIG. 1E, and this process may be omitted. For example, in a case where the irregularity formed in the surface of the magnetic layer 2 is shallow, a protective layer is formed on the surface of the magnetic layer 2 without performing the above-described planarization processing, whereby a magnetic recording medium on which the irregularity remains is obtained. In this case, a floating height of a head in a magnetic recording and reproducing device decreases, but it is possible to realize a magnetic recording and reproducing device without any problem.

In addition, in this case, it is preferable that the depth of the irregularity formed in the magnetic layer 2 be 10 nm or less, and more preferably 6 nm or less. In addition, in a case where the depth of the irregularity exceeds 10 nm, the floating height of the head significantly decreases, and it is easy for the head and the magnetic recording medium to come into contact with each other during magnetic recording and reproducing, thereby eventually leading to damage.

Figure 1F:
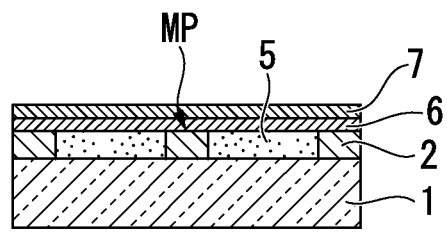
FIG. 1F is a cross-sectional diagram illustrating the method of manufacturing a magnetic recording medium to which the invention is applied.

Next, as shown in FIG. 1F, a protective layer 6 is formed on the magnetic layer 2 and the non-magnetic layer 5, and then a lubricant is applied on the protective layer 6 to form a lubricating film 7.

After being subjected to the above-described processes, a magnetic recording medium having magnetic recording patterns MP that are magnetically separated may be manufactured.

As described above, according to the invention, it is possible to remove the mask layer 3 that remains on the magnetic layer 2 without causing magnetic damage to the magnetic layer 2. Therefore, according to the invention, it is possible to manufacture a magnetic recording medium that has excellent magnetic separation performance of the magnetic recording patterns MP with high productivity. In addition, in a magnetic recording and reproducing device that uses the magnetic recording medium, electromagnetic conversion characteristics may be further improved.

In addition, the magnetic recording patterns in the invention are patterns in which magnetic recording data is disposed with constant regularity for a bit, and may include data serving as a servo signal among the data. For example, a bit-pattern type represents a type in which each bit of the magnetic recording data is recorded in a magnetically separated individual area. In addition, a discrete track type represents a type in which several bit streams are continuously recorded in a magnetically separated arc-shaped area among areas that are formed in a circumferential shape and are adjacent to each other in a radial direction. In addition, a patterned medium represents a magnetic recording medium having a magnetic layer of the bit-pattern type or the discrete track type, which is formed in a magnetically separated area.

In addition, the magnetic recording patterns in the invention are not limited to a state in which parts of the above-described magnetic layer are completely separated by the non-magnetic layer. When the magnetic layer is separated when viewed on a surface side, even though a bottom portion of the magnetic layer is not separated, it is possible to accomplish the object of the invention, and this separation state is included in a concept of the magnetic recording patterns of the invention, which are magnetically separated.

In addition, in the invention, when the magnetic layer 2 is patterned into a shape corresponding to the mask layer 3 by using the mask layer 3, ion implantation may be performed with respect to the surface of the magnetic layer 2 not covered with the mask layer 3 to demagnetize corresponding positions.

For example, ions such as $P^+$, $N_2^+$, $N^+$, $C^+$, $He^+$, $Ne^+$, $Ar^+$, $Kr^+$, $Xe^+$, $As^+$, $F^+$, $Si^+$, and $B^+$ were implanted from an upper side of the mask layer 3 that is patterned. In this case, a crystalline structure of an ion implantation portion of the magnetic layer 2 is disturbed, or the ion reacts with Co, Fe, Ni, or the like that is contained in the magnetic layer 2 to cause the portion to have a non-magnetic structure, whereby the portion of the magnetic layer 2 not covered with the mask layer 3 may be demagnetized.

In a case of patterning the magnetic layer 2 by ion implantation, it is preferable to adjust ion implantation conditions in such a manner that the magnetic layer 2 is not etched by the ion implantation, or even when the etching occurs, an etching depth becomes 5 nm or less. According to this adjustment, a planarization treatment after peeling-off of the mask layer 3 becomes unnecessary.

In addition, in the invention, after the magnetic layer 2 is etched, the non-magnetic layer 5 may be embedded in the irregularity formed in the surface of the magnetic layer 2, and then a surplus of the non-magnetic layer 5, which is higher than the height of a convex surface that is formed in the magnetic layer 2, may be removed together with the mask layer 3 by using the above-described method of the invention.

In this case, in the non-magnetic layer 5, it is preferable to use a C film, a resin film, or a non-magnetic material formed from a metallic film of at least one kind selected from Ni, Fe, Co, and Cr or an alloy film containing plural kinds thereof. In addition, for example, CrNi, CoCr, CrFe, CNi, CCo, CFe, CCr, or the like may be appropriately used for the alloy film. In addition, it is not necessary to form the non-magnetic layer 5 of this case in a thickness larger than that of the mask layer 3, and irregularity may remain on the surface thereof.

Magnetic Recording Medium

Next, a specific configuration of the magnetic recording medium that is manufactured by applying the invention will be described in detail with reference to a magnetic recording medium 30 shown in FIG. 2 as an example.

The magnetic recording medium 30 is a so-called patterned medium including a recording magnetic layer 34 constituted by an area in which magnetic recording patterns 34a to be described later are magnetically separated by a non-magnetic layer 37.

In addition, in the following description, the exemplified magnetic recording medium 30 is illustrative only, and a magnetic recording medium manufactured by applying the invention is not necessarily limited to such a configuration, and may be carried out after being appropriately modified within a scope not changing the gist of the invention.

Figure 2:
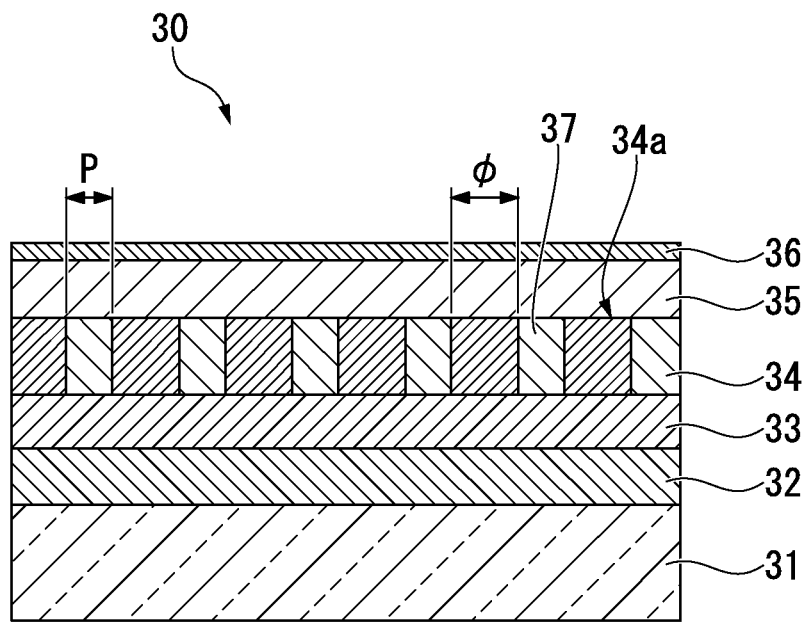
FIG. 2 is a cross-sectional diagram illustrating an example of the magnetic recording medium manufactured by application of the invention.

As shown in FIG. 2, the magnetic recording medium 30 has a structure in which a soft magnetic layer 32, an intermediate layer 33, the recording magnetic layer 34 having the magnetic recording patterns 34a, and a protective layer 35 are sequentially laminated on both surfaces of a non-magnetic substrate 31. Furthermore, the magnetic recording medium 30 has a structure in which a lubricating film 36 is formed at the outermost surface. In addition, in FIG. 3, only one surface of the non-magnetic substrate 31 is illustrated.

Examples of the non-magnetic substrate 31 include various substrates such as an Al alloy substrate formed from an Al—Mg alloy or the like that contains Al as a main component, a glass substrate formed from soda-lime glass, aluminosilicate-based glass, crystallized glass, or the like, a silicon substrate, a titanium substrate, a ceramics substrate, a resin substrate, and the like. Among these, it is preferable to use the Al alloy substrate, the glass substrate, or the silicon substrate. In addition, it is preferable that the average surface roughness (Ra) of the non-magnetic substrate 31 be 1 nm or less, more preferably 0.5 nm or less, and still more preferably 0.1 nm or less.

The soft magnetic layer 32 has a function of enlarging a component of a magnetic flux, which is generated from the magnetic head, in a direction orthogonal to a substrate surface, and a function of firmly fixing a magnetization direction of the recording magnetic layer 34 on which information is recorded in a direction orthogonal to the non-magnetic substrate 31. These functions become significant, particularly, in a case where a head having a basic structure with a single magnetic pole is used as a recording and reproducing magnetic head.

As the soft magnetic layer 32, for example, a soft magnetic material of an amorphous or fine-crystalline structure, which contains Fe, Ni, Co, or the like, may be used. Examples of specific soft magnetic material include CoFe-based alloys (CoFeTaZr, CoFeZrNb, and the like), FeCo-based alloys (FeCo, FeCoB, FeCoV, and the like), FeNi-based alloys (FeNi, FeNiMo, FeNiCr, FeNiSi, and the like), FeAl-based alloys (FeAl, FeAlSi, FeAlSiCr, FeAlO, and the like), FeTa-based alloys (FeTa, FeTaC, FeTaN, and the like), FeMg-based alloys (FeMgO and the like), FeZr-based alloys (FeZrNb, FeZrN, and the like), FeC-based alloys, FeN-based alloys, FeSi-based alloys, FeP-based alloys, FeNb-based alloys, FeHf-based alloys, FeB-based alloys, and the like.

In addition to these, as the soft magnetic layer 32, a Co alloy, which contains Co as a main component, contains at least one kind selected from Zr, Nb, Ta, Cr, Mo, and the like, and has an amorphous or fine crystalline structure, may be used. As a specific material thereof, for example, CoZr, CoZrNb, CoZrTa, CoZrCr, CoZrMo, and the like may be exemplified as a very suitable material.

It is preferable that the soft magnetic layer 32 be formed from soft magnetic films of two layers or more, and a Ru film be provided between laminated soft magnetic films. When the film thickness of the Ru film is adjusted within a range of 0.4 to 1.0 nm or 1.6 to 2.6 nm, antiferro coupling (AFC) occurs between the upper and lower soft magnetic films with the Ru film interposed therebetween, and thus it is possible to suppress a so-called spike noise.

It is preferable that the number layers of the soft magnetic film be even. According to this, plural kinds of magnetization that are opposite to each other are cancelled out by each other by the AFC, and as a result, the entirety of residual magnetism of the soft magnetic layer 32 becomes zero, whereby a magnetic effect (noise) during reproduction of a signal may be suppressed. On the other hand, even when the number of layers of the soft magnetic film is odd, the same effect may be obtained by making the total magnetism of odd-numbered films and the total magnetism of even-numbered soft magnetic films from a substrate side be equal to each other.

The intermediate layer 33 functions as an orientation control layer that controls orientation or a crystal size of an immediately upper layer. It is preferable to use an appropriate material for the intermediate layer 33 in accordance with a type of recording magnetic layer 34. For example, in a case of using a Co-based material (CoCrPt, CoPt, CoPd, or the like) as the recording magnetic layer 34, it is preferable to use a Ru-based alloy material that contains a Ru elementary substance or Ru as a main component, contains at least one kind selected from Cr, Co, Fe, Ni, C, and the like, and has an hcp crystalline structure. In addition, it is preferable that a C-axis of the hcp crystalline structure be formed to be orthogonal to the non-magnetic substrate 31.

Specifically, a film of an alloy (Ni, NiW, NiCr, NiTa, or the like), which contains Ni as a main component, is formed on the soft magnetic layer 32, and a Ru-based alloy film is formed thereon. The Ni-based alloy film may be substituted with a Pt-based alloy, a Ta-based alloy, or a C-based alloy. In addition, as the Ru-based alloy, for example, a material having a granular structure to which an oxide such as $SiO_2$, $Cr_2O_3$, and $TiO_2$ is added may be used.

In addition to this, in a case of using a Fe-based alloy material as the recording magnetic layer 34, it is preferable to use MgO, C, Mo, or the like as the intermediate layer 33.

Although the recording magnetic layer 34 is a horizontal magnetic layer, for an in-plane magnetic recording medium, or a vertical magnetic layer for a vertical magnetic recording medium, it does not matter. However, the vertical magnetic layer is preferable so as to realize relatively high recording density.

In a case of the so-called discrete track type magnetic recording medium in which the circumference-shaped magnetic recording patterns 34a formed on the recording magnetic layer 34 are magnetically separated by the non-magnetic layer 37, it is preferable that the recording magnetic layer 34 be formed from an alloy containing Co as a main component. For example, a CoCrPt-based magnetic layer, a CoCrPtB-based magnetic layer, a CoCrPtTa-based magnetic layer, or a magnetic layer having a granular structure in which an oxide such as $SiO_2$ and $Cr_2O_3$ is added to the magnetic layers may be appropriately used.

In a case of the discrete track type magnetic recording medium of a vertical magnetic recording type, for example, a laminated body, which is obtained by laminating the soft magnetic layer 32 formed from a soft magnetic FeCo alloy (FeCoB, FeCoSiB, FeCoZr, FeCoZrB, FeCoZrBCu, or the like), an FeTa alloy (FeTaN, FeTaC, or the like), or a Co alloy (CoTaZr, CoZrNB, CoB, or the like), the intermediate layer 33 formed from Ru or the like, and the recording magnetic layer 34 formed from a 60Co-15Cr-15Pt alloy or a 70Co-5Cr-15Pt-10SiO$_2$ alloy, may be used. In addition, an orientation control film formed from Pt, Pd, NiCr, NiFeCr, or the like may be laminated between the soft magnetic layer 32 and the intermediate layer 33.

On the other hand, in the case of the in-plane magnetic recording medium, a laminated body, which is obtained by laminating a non-magnetic CrMo underlying layer and a CoCrPtTa magnetic layer having ferromagnetism, may be used as the recording magnetic layer 34.

It is preferable that the thickness of the recording magnetic layer 34 be set in the range of 3 to 20 nm, and more preferably in the range of 5 to 15 nm. In addition, the recording magnetic layer 34 may be fowled to obtain sufficient head input and output in accordance with a kind of magnetic alloy that is used, and a lamination structure. In addition, it is necessary for the recording magnetic layer 34 to have a film thickness of some extent so as to obtain a constant output during reproduction. On the other hand, since parameters representing recording and reproducing characteristics commonly deteriorate along an increasing output, it is necessary to set the film thickness to an optimal film thickness. Commonly, the recording magnetic layer 34 is formed as a thin film by a sputtering method.

As the recording magnetic layer 34 of the granular structure, a layer which includes at least Co and Cr as a magnetic particle and includes at least one kind or two kinds or more selected from a Si oxide, a Cr oxide, a Ti oxide, a W oxide, a Co oxide, a Ta oxide, and a Ru oxide in a grain boundary of magnetic particles is preferable. Specifically, examples of this layer include CoCrPt—Si oxide, CoCrPt—Cr oxide, CoCrPt—W oxide, CoCrPt—Co oxide, CoCrPt—Cr oxide-W oxide, CoCrPt—Cr oxide-Ru oxide, CoRuPt—Cr oxide-Si oxide, CoCrPtRu—Cr oxide-Si oxide, and the like.

It is preferable that an average particle size of a magnetic crystal grain having a granular structure be 5 to 8 nm. In addition, it is preferable that a total amount of an oxide that is present in the magnetic layer be 3 to 15 mol %.

In a case of a so-called bit pattern type magnetic recording medium in which dot-shaped magnetic recording patterns 34a formed in the recording magnetic layer 34 are magnetically separated by the non-magnetic layer 37, as the recording magnetic layer 34, it is preferable to use, for example, a high-Ku magnetic material such as CoPt, FePt, and CoPd from the viewpoint of obtaining sufficient thermal fluctuation resistance.

For example, 80Co-20Pt or 75Co-25Pt may be appropriately used as the CoPt-based alloy, and 50Fe-50Pt, 45Fe-45Pt-10Cu, 45Fe-45Pt-10C, or the like may be appropriately used as the FePt-based alloy.

A film of the high-Ku magnetic material may be formed by a sputtering method, or may be formed by a lamination method in which each constituent element is sequentially deposited. For example, in a case of the CoPd-based magnetic material, the lamination method in which Co and Pd are alternately deposited is preferable.

It is effective to perform a treatment of increasing crystallinity by a thermal treatment (annealing) after forming a film of Ku magnetic material, and for example, it is preferable to perform annealing under the conditions of 300° C. or higher and 15 minutes to 4 hours in a vacuum atmosphere. In addition, the annealing temperature may be set to a temperature that is appropriate for each material, and for example, it is preferable that the annealing temperature be set to 400° C. for the CoPt alloy, and 500° C. for the FePt-based alloy.

In addition, in the bit pattern type magnetic recording medium 30, it is preferable that a dot diameter φ of each of the magnetic recording patterns 34a in the recording magnetic layer 34 be set in the range of 5 to 15 nm so as to increase recording density. In addition, it is preferable that a pitch P between dots be set in the range of 3 to 25 nm, and it is preferable that the pitch P be set to be as narrow as possible so as to increase the recording density. On the other hand, when the pitch P is too narrow, the magnetic separation becomes insufficient, and thus an operation between dots increases. As a result, it is difficult for the recorded magnetic data to be maintained.

A material that is commonly used in magnetic recording mediums may be used for the protective layer 35. Examples of the material include a carbonaceous material such as carbon (C), hydrogenated carbon (HXC), nitrogenated carbon (CN), amorphous carbon, silicon carbide (SiC), $SiO_2$, $Zr_2O_3$, TiN, and the like. In addition, the protective layer 35 may be layered in which two layers or more are laminated. When the thickness of the protective layer 35 exceeds 10 nm, a distance between the magnetic head and the recording magnetic layer 34 increases and thus it is difficult to have sufficient input and output characteristics. Therefore, it is preferable that the thickness of the protective layer 35 be set to be less than 10 nm.

For example, a lubricating film 36 may be formed by applying a fluorine-based lubricant, a hydrocarbon-based lubricant, or a lubricant formed from a mixture of these lubricants on the protective layer 35. In addition, the film thickness of the lubricating film 36 being approximately 1 to 4 nm is common.

As described above, with the method of manufacturing the magnetic recording medium, to which the above-described invention is applied, a manufacturing process becomes simple, and thus the magnetic recording medium (patterned medium) 30 having a magnetic layer constructed by magnetically separating areas may be manufactured with high productivity.

Magnetic Recording and Reproducing Device

Next, a magnetic recording and reproducing device (HDD) to which the invention is applied will be described.

Figure 3:
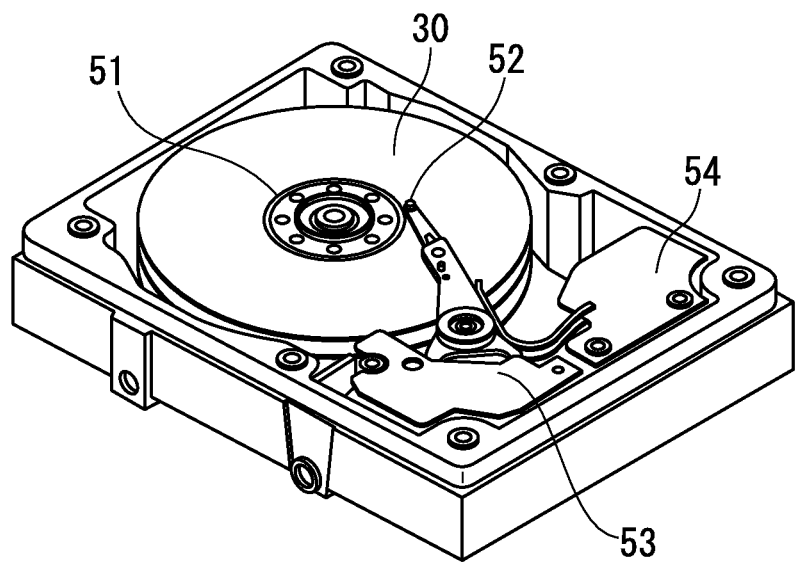
FIG. 3 is a perspective diagram illustrating a configuration example of a magnetic recording and reproducing device.

For example, as shown in FIG. 3, the magnetic recording and reproducing device, to which the invention is applied, includes the above-described magnetic recording medium 30, a rotary drive unit 51 that rotationally drives the above-described magnetic recording medium 30, a magnetic head 52 that performs an recording operation and a reproducing operation with respect to the above-described magnetic recording medium 30, a head-driving unit 53 that moves magnetic head 52 in a diameter direction of the magnetic recording medium 30, and a recording and reproducing signal-processing system 54 that performs a signal input to the magnetic head 52 and a signal output from the magnetic head 52.

When the above-described magnetic recording medium 30 is used in the magnetic recording and reproducing device, writing blur during the magnetic recording on the magnetic recording medium 30 may be eliminated, and thus a high surface recording density may be obtained. That is, when the above-described magnetic recording medium 30 is used, it is possible to construct a magnetic recording and reproducing device with a high recording density. In addition, the magnetic recording medium 30 is processed in such a manner that recording tracks become magnetically non-continuous in a diameter direction. According to this, compared to a case in which a reproducing head width is made smaller than a recording head width so as to exclude an effect of magnetization transition region of a track edge portion in the related art, the magnetic recording medium 30 may operate in a state in which the reproducing head width and the recording head width are set to be the same as each other. Therefore, a sufficient reproducing output and high SNR may be obtained.

Furthermore, when a reproduction unit of the magnetic head 52 is constructed by a GMR head or a TMR head, sufficient signal intensity may be obtained even in a high recording density, and thus a magnetic recording and reproducing device having a high recording density may be realized. In addition, when a floating height of the magnetic head 52 is set within a range of 0.005 to 0.020 μm, and the magnetic head 52 floats at a height lower than that of the related art, an output is improved, and thus a high device SNR may be obtained. As a result, a magnetic recording and reproducing device with a high capacity and reliability may be provided.

Furthermore, when a signal-processing circuit in accordance with a maximum likelihood decoding method is combined, recording density may be relatively further improved. For example, even when the recording and reproducing is performed in a track density of 400 k track/inch or more, linear recording density of 1,500 kbit/inch or more, and recording density of 600 Gbit per square inch or more, a sufficient SNR may be obtained.

EXAMPLES

Hereinafter, an effect of the invention will be made more apparent from examples. In addition, the invention is not limited to the following examples, and appropriate modification may be made within a scope and not changing the gist of the invention.

Example 1

In Example 1, first, a glass substrate (an outer size: 2.5 inches, manufactured by Konica Minolta Holdings, Inc.), after being washed, was accommodated in a film-forming chamber of a DC magnetron sputtering device (C-3040, manufactured by Anelva Corporation), and the inside of the film-forming chamber was evacuated until the degree of vacuum reached $1\times10^{-5}$ Pa, and then an adhesion layer having a layer thickness of 10 nm was formed on the glass substrate using a Cr target. Here, the glass substrate that was used had an outer diameter of 65 mm, an inner diameter of 20 mm, and average surface roughness (Ra) of 0.2 nm.

Next, an FeCoB film having a layer thickness of 60 nm as a soft magnetic layer, a Ru film having a layer thickness of 10 nm as an intermediate layer, and a 80Co-20Pt alloy film having a layer thickness of 10 nm as a recording magnetic layer were laminated in this order using a DC sputtering method.

Next, as a mask layer, a carbon film of 20 nm and a silicon film of 5 nm were formed as a mask layer on the recording magnetic layer in this order by a sputtering method.

Next, a resist material was applied on the silicon film by a spin coating method to form a resist layer having a layer thickness of 40 nm. In addition, as the resist material, an epoxy-based, ultraviolet-resin was used. In addition, a glass stamp having a positive pattern of the magnetic recording patterns was used, and an ultraviolet ray having a wavelength of 365 nm was emitted from an upper side of the glass stamp of which the transmittance of ultraviolet ray is 95% or more, for 10 seconds to cure the resist layer in a state in which the stamp was pressed on to the resist layer at a pressure of 1 MPa (approximately 10 kgf/cm$^2$). Then, the stamp was separated from the resist layer and the irregularity patterns corresponding to the magnetic recording patterns were transferred on to the resist layer.

In addition, the irregularity patterns that were transferred on to the resist layer corresponded to the magnetic recording patterns of 2 terabits (Tbpsi) per square inch, and thus tracks that were equally spaced along a circumference were formed, in which a convex portion of a data region had a cylinder (dot) shape with a diameter of 10 nm, and a distance between adjacent convexities in a circumferential direction was 17.96 nm. In addition, midway, 256 servo regions were provided to cross the tracks. The resist layer had a layer thickness of 55 nm at a convex portion and approximately 10 nm at a concave portion.

Next, the concave portion of the resist layer and the silicon film under the concave portion were removed by dry etching. As dry etching conditions at this time, a flow rate of CF$_4$ gas was set to 40 sccm, a pressure was set to 0.3 Pa, radio-frequency plasma power was set to 300 W, an RF bias was set to 10 W, and an etching time was set to 15 seconds. Then, the carbon film was removed by dry etching through an opening formed in the silicon film. As dry etching conditions, a flow rate of O$_2$ gas was set to 40 sccm, a pressure was set to 0.5 Pa, radio-frequency plasma power was set to 200 W, an RF bias was set to 50 W, and an etching time was set to 40 seconds.

Next, a portion of the recording magnetic layer which was not covered with the mask layer was processed by an ion beam. As processing conditions by the ion beam, a flow rate of Ar gas was set to 5 sccm, a pressure was set to 0.05 Pa, a radio-frequency plasma power was set to 200 W, an acceleration voltage was set to 1,000 V, a drawing voltage was set to −500 V, and a processing time was set to 30 seconds.

Next, removal of the mask layer was performed. As processing conditions, a flow rate of gasified methanol that was used as a peeling gas was set to 40 sccm, a pressure was set to 0.5 Pa, radio-frequency plasma power was set to 600 W, a DC bias was set to 50 V, and an etching time was set to 30 seconds. Under these conditions, a surface of a magnetic layer of a convex portion was exposed, and the carbon film, the silicon film, and the resist film were removed.

Next, 50Al-50Ti film of 50 nm as a non-magnetic layer was formed on the processed surface, and then the recording magnetic layer of the convex portion was exposed by a planarization process using an ion beam. As processing conditions by the ion beam, a flow rate of an argon gas was set to 30 sccm, a pressure was set to 2.0 Pa, a radio-frequency plasma power was set to 300 W, an acceleration voltage was set to 300 V, and a drawing voltage was set to −300 V. SIMS was used to monitor the peak of Co to perform an end point detection, and the end point detection was stopped after the recording magnetic layer of the convex portion was exposed. It took 120 seconds. Average surface roughness (Ra) at this time was measured using an additional atomic force microscope (AFM), and 0.25 nm (a visual field of 1 μm square) was obtained.

Next, a DLC film having a thickness of 4 nm was fowled using a CVD method, and a lubricant was applied in a thickness of 2 nm, whereby a magnetic recording medium was manufactured.

Electromagnetic conversion characteristics of the magnetic recording medium which was manufactured by the above-described method were measured. Evaluation of the electromagnetic conversion characteristics was performed using a spin stand. At this time, in regard to evaluation heads, a vertical recording head was used as a recording head, and a TuMR head was used as a reading head.

A magnetic field was applied in advance in a direction orthogonal to the substrate using a dedicated erasing device having magnets at upper and lower sides of the substrate to perform DC erasing. This medium was allowed to rotate at 7,200 revolutions per minute, and it was confirmed that positioning might be correctly performed using the above-described head.

Then, a signal of a data region was read out, and Fourier transformation was performed using an oscilloscope. From this transformation, at a radius of 20 mm, a peak was obtained at 839.2 MHz. This is a frequency corresponding to a dot interval of 17.96 nm, and it could be seen that patterns were correctly formed with a specification of 2 Tbpsi. BER during recording of a signal in accordance with the frequency was measured. As a result, BER was 10 to the power of −7.9. Furthermore, average surface roughness (Ra) of the manufactured magnetic recording medium was measured by an additional atomic force microscope (AFM), and 0.25 nm (a visual field of 1 μm square) was obtained. Hereinafter, collected evaluation results are shown in Table 1.

In addition, before and after removing the mask layer, confirmation of static magnetic characteristics (coercive force) was performed. With respect to the evaluation of the static magnetic characteristics, a device using a Kerr effect was used. As a result, as shown in Table 1, a variation in the static magnetic characteristic before and after removing the mask layer was not observed. In addition, with respect to the static magnetic characteristics before removing the mask layer, an effect of magnetism due to the mask layer was removed through calculation, and magnetic characteristics of the recording magnetic layer were calculated.

TABLE 1

| numbers | Mask material | Peeling gas Compositional formula | Peeling gas Name | Residual of mask | Coercive force (kOe) Before removing mask | Coercive force (kOe) After Removing mask | Surface roughness Ra of medium (nm) | BER |
|---|---|---|---|---|---|---|---|---|
| Example 1 | C 20 nm/Si 5 nm/resist | $CH_3OH$ | Methanol | Not present | 5.024 | 5.023 | 0.25 | −7.9 |
| Example 2 | C 20 nm/Si 5 nm/resist | $CH_3CH_2OH$ | Ethanol | Not present | 5.026 | 5.022 | 0.25 | −7.7 |
| Example 3 | C 20 nm/Si 5 nm/resist | $CH_3CH_2CH_2OH$ | Propanol | Not present | 5.025 | 5.022 | 0.25 | −7.9 |
| Example 4 | C 20 nm/Si 5 nm/resist | $CH_3COCH_3$ | Acetone | Not present | 5.028 | 5.015 | 0.25 | −7.8 |
| Example 5 | C 20 nm/Si 5 nm/resist | $CH_3CH_2COCH_3$ | Methyl ethyl ketone | Not present | 5.025 | 5.021 | 0.25 | −8.0 |
| Example 6 | C 20 nm/Si 5 nm/resist | $C_5H_{10}CO$ | Cvolohexanone | Not present | 5.027 | 5.017 | 0.26 | −7.9 |
| Example 7 | C 20 nm/Si 5 nm/resist | $C_4H_8O$ | Tetrahydrofuran | Not present | 5.031 | 5.017 | 0.25 | −7.7 |
| Example 8 | C 20 nm/Si 5 nm/resist | $CH_3COOC_2H_5$ | Ethyl acetate ester | Not present | 5.032 | 5.022 | 0.26 | −7.9 |
| Example 9 | C 20 nm/Si 5 nm/resist | $(CH_3)_2O$ | Dimethyl ether | Not present | 5.025 | 5.023 | 0.25 | −8.0 |
| Example 10 | C 20 nm/Si 5 nm/resist | $CH_3CH_2OCH_3$ | Ethyl methyl ether | Not present | 5.026 | 5.022 | 0.26 | −7.7 |
| Example 11 | C 20 nm/Si 5 nm/resist | $(CH_3CH_2)_2O$ | Diethyl ether | Not present | 5.031 | 5.016 | 0.26 | −7.7 |
| Example 12 | C 20 nm/Si 5 nm/resist | $CH_3CHO$ | Acetaldehyde | Not present | 5.024 | 5.024 | 0.26 | −7.8 |
| Example 13 | C 20 nm/Si 5 nm/resist | $HCHO$ | Formaldehyde | Not present | 5.031 | 5.025 | 0.26 | −7.7 |
| Example 14 | C 20 nm/Si 5 nm/resist | $HCOOH$ | Formic acid | Not present | 5.024 | 5.025 | 0.25 | −7.9 |
| Example 15 | C 20 nm/Si 5 nm/resist | $CH_3COOH$ | Acetic acid | Not present | 5.026 | 5.021 | 0.25 | −7.9 |
| Example 16 | C 20 nm/Si 5 nm/resist | $C_6H_4(CH_3O)_2$ | Anisole | Not present | 5.026 | 5.020 | 0.25 | −7.9 |
| Example 17 | C 20 nm/Si 5 nm/resist | $CH_3CH_2OCH_2CHCH_3(OH)$ | Propylene glycol monoethyl ether | Not present | 5.031 | 5.025 | 0.26 | −7.8 |
| Example 18 | C 20 nm/Si 5 nm/resist | $CH_3COOCH(CH_3)CH_2OCH_3$ | Propylene glycol monoethyl ether acetate | Not present | 5.032 | 5.024 | 0.25 | −7.9 |
| Example 19 | C 50 nm/Ni 5 nm/resist | $CH_3OH$ | Methanol | Not present | 5.032 | 5.023 | 0.26 | −7.8 |
| Example 20 | C 50 nm/Cr 5 nm/resist | $CH_3OH$ | Methanol | Not present | 5.033 | 5.023 | 0.26 | −7.8 |

Examples 2 to 18

In Examples 2 to 18, manufacturing and evaluation of the magnetic recording medium were performed in the same manner as Example 1 except that each material shown in Table 1 was used as the gas that peels off the mask layer, and each appropriate treatment time was set. Evaluation results thereof are shown in Table 1.

Example 19

In Example 19, as a mask layer, a carbon film of 50 nm and a nickel film of 5 nm were formed in this order by a sputtering method. Then, a resist was applied on the nickel film by a spin coating method to form a resist layer having a layer thickness of 40 nm. In addition, as the resist, an epoxy-based, ultraviolet-curable resin was used. In addition, a glass stamp having a positive pattern of the magnetic recording patterns was used, and an ultraviolet ray having a wavelength of 365 nm was emitted from an upper side of the glass stamp of which the transmittance of ultraviolet ray is 95% or more for 10 seconds to cure the resist layer in a state in which the stamp was pressed on to the resist layer at a pressure of 1 MPa (approximately 10 kgf/cm²). Then, the stamp was separated from the resist layer and irregularity patterns corresponding to the magnetic recording patterns were transferred on to the resist layer.

Next, the concave portion of the resist layer and the nickel film under the concave portion were removed by an ion beam. As conditions of the ion beam at this time, a flow rate of argon gas was set to 40 sccm, a pressure was set to 0.05 Pa, radio-frequency plasma power was set to 200 W, an acceleration voltage was 1,000 V, a drawing voltage was set to −500 V, and an etching time was set to 20 seconds. Then, the carbon film was removed by dry etching through an opening formed in the nickel film. As dry etching conditions, a flow rate of $O_2$ gas was set to 40 sccm, a pressure was set to 0.5 Pa, radio-frequency plasma power was set to 200 W, an RF bias was set to 50 W, and an etching time was set to 100 seconds.

Manufacturing and evaluation of the magnetic recording medium were performed in the same manner as Example 1 except for the above descriptions. Evaluation results thereof are shown in Table 1.

Example 20

In Example 20, as a mask layer, a carbon film of 50 nm and a chrome film of 5 nm were formed in this order by a sputtering method. Then, a resist was applied on the chrome film by a spin coating method to form a resist layer having a layer thickness of 40 nm. In addition, as the resist, an epoxy-based, ultraviolet-curable resin was used. In addition, a glass stamp having a positive pattern of the magnetic recording patterns was used, and an ultraviolet ray having a wavelength of 365 nm was emitted from an upper side of the glass stamp of which the transmittance of ultraviolet ray is 95% or more for 10 seconds to cure the resist layer in a state in which the stamp was pressed on to the resist layer at a pressure of 1 MPa (approximately 10 kgf/cm²). Then, the stamp was separated from the resist layer and irregularity patterns corresponding to the magnetic recording patterns were transferred on to the resist layer.

Next, the concave portion of the resist layer and the chrome film under the concave portion were removed by an ion beam. As conditions of the ion beam, a flow rate of argon gas was set to 40 sccm, a pressure was set to 0.05 Pa, radio-frequency plasma power was set to 200 W, an acceleration voltage was 1,000 V, a drawing voltage was set to −500 V, and an etching time was set to 20 seconds. Then, the carbon film was removed by dry etching through an opening formed in the chrome film. As dry etching conditions, a flow rate of $O_2$ gas was set to 40 sccm, a pressure was set to 0.5 Pa, radio-frequency plasma power was set to 200 W, an RF bias was set to 50 W, and an etching time was set to 100 seconds.

Manufacturing and evaluation of the magnetic recording medium were performed in the same manner as Example 1 except for the above descriptions. Evaluation results thereof are shown in Table 1.

of which the transmittance of ultraviolet ray is 95% or more for 10 seconds to cure the resist layer in a state in which the stamp was pressed on to the resist layer at a pressure of 1 MPa (approximately 10 kgf/cm$^2$). Then, the stamp was separated

TABLE 2

| Numbers | Mask material | Peeling gas | | Residual of mask | Coercive force (kOe) | | Surface roughness Ra of medium (nm) | BER |
|---|---|---|---|---|---|---|---|---|
| | | Compositional formula | Name | | Before Removing mask | After Removing mask | | |
| Example 21 | C 50 nm/Al 4 nm/resist | CH$_3$OH | Methanol | Not present | 5.033 | 5.025 | 0.26 | −7.8 |
| Example 22 | C 50 nm/Cu 5 nm/resist | CH$_3$OH | Methanol | Not present | 5.032 | 5.024 | 0.26 | −7.8 |
| Example 23 | C 50 nm/Au 5 nm/resist | CH$_3$OH | Methanol | Not present | 5.032 | 5.021 | 0.26 | −7.8 |
| Example 24 | C 50 nm/Pt 3 nm/resist | CH$_3$OH | Methanol | Not present | 5.032 | 5.023 | 0.26 | −7.8 |
| Example 25 | C 50 nm/Mo 4 nm/resist | CH$_3$OH | Methanol | Not present | 5.031 | 5.023 | 0.26 | −7.8 |
| Example 26 | C 50 nm/W 4 nm/resist | CH$_3$OH | Methanol | Not present | 5.032 | 5.026 | 0.26 | −7.8 |
| Example 27 | C 50 nm/Cr 3 nm/Ni 4 nm/resist | CH$_3$OH | Methanol | Not present | 5.032 | 5.026 | 0.25 | −8.2 |
| Example 28 | C 50 nm/Al 3 nm/Au 4 nm/resist | CH$_3$OH | Methanol | Not present | 5.032 | 5.026 | 0.25 | −8.1 |
| Example 29 | C 50 nm/Si 10 nm/Ni 5 nm/C 20nm/Si | CH$_3$OH | Methanol | Not present | 5.025 | 5.025 | 0.24 | −8.4 |
| Example 30 | Ni 20 nm/Si 5 nm/resist | CH$_3$OH | Methanol | Not present | 5.03 | 5.031 | 0.25 | −7.9 |
| Example 31 | Co 20 nm/Si 5 nm/resist | CH$_3$OH | Methanol | Not present | 5.023 | 5.023 | 0.25 | −7.9 |
| Example 32 | Fe 20 nm/Si 5 nm/resist | CH$_3$OH | Methanol | Notpresent | 5.048 | 5.044 | 0.25 | −7.9 |
| Example 33 | Cr 15 nm/Si 5 nm/resist | CH$_3$OH | Methanol | Not present | 5.023 | 5.026 | 0.26 | −7.9 |
| Example 34 | 50Cr-50Ni 20 nm/Al 4 nm/resist | CH$_3$OH | Methanol | Not present | 5.031 | 5.028 | 0.25 | −7.8 |
| Example 35 | 50Cr-50Fe 20 nm/Cu 5 nm/resist | CH$_3$OH | Methanol | Not present | 5.036 | 5.035 | 0.25 | −7.9 |
| Example 36 | 40C-60Ni 20 nm/Mo 4 nm/resist | CH$_3$OH | Methanol | Not present | 5.042 | 5.04 | 0.26 | −8.0 |
| Example 37 | 65Co-35Ni 20 nm/W 4 nm/resist | CH$_3$OH | Methanol | Not present | 5.04 | 5.044 | 0.25 | −7.9 |
| Example 38 | 30C-70Ni 20 nm/Au 5 nm/resist | CH$_3$OH | Methanol | Not present | 5.032 | 5.031 | 0.25 | −7.9 |
| Example 39 | 30C-70Ni 20 nm/Pt 3 nm/resist | CH$_3$OH | Methanol | Not present | 5.03 | 5.03 | 0.25 | −7.9 |
| Comparative Example 1 | C 20 nm/Si 5 nm/resist | O$_2$ | Oxygen | Not present | 5.028 | 5.823 | 0.25 | −4.2 |
| Comparative Example 2 | C 20 nm/Si 5 rim/resist | N$_2$ | Nitrogen | Not present | 5.029 | 4.852 | 0.25 | −4.5 |
| Comparative Example 3 | C 20 nm/Si 5 nm/resist | H$_2$ | Hydrogen | Present | 5.024 | 4.525 | 0.75 | Evaluation was impossible |
| Comparative Example 4 | C 20 nm/Mn 5 nm/resist | Since recording magnetic layer could not be processed and thus process was stopped | — | — | — | — | — | — |
| Comparative Example 5 | Ni 20 nm/Si 5 nm/resist | N$_2$ | Nitrogen | Present | 5.03 | 4.495 | Stopped | Stopped |

Examples 21 to 28

In Examples 21 to 28, as a mask layer, a carbon film having a film thickness of 50 nm and a metal film of each mask material shown in Table 2, each of which has an appropriate film thickness, were laminated for each appropriate treatment time.

Manufacturing and evaluation of the magnetic recording medium were performed in the same manner as Example 1 except for the above descriptions. Evaluation results thereof are shown in Table 2.

Example 29

In Example 29, as a mask layer, a carbon film of 50 nm, a silicon film of 10 nm, a nickel film of 5 nm, a carbon film of 20 nm, and a silicon film of 5 nm were formed in this order by a sputtering method. Then, a resist was applied on the silicon film by a spin coating method to form a resist layer having a layer thickness of 40 nm. In addition, as the resist, an epoxy-based, ultraviolet-curable resin was used. In addition, a glass stamp having a positive pattern of the magnetic recording patterns was used, and an ultraviolet ray having a wavelength of 365 nm was emitted from an upper side of the glass stamp from the resist layer and irregularity patterns corresponding to the magnetic recording patterns were transferred on to the resist layer.

Next, the concave portion of the resist layer and the silicon film under the concave portion were removed by dry etching. As conditions of the dry etching, a flow rate of CF$_4$ gas was set to 40 sccm, a pressure was set to 0.3 Pa, radio-frequency plasma power was set to 300 W, an RF bias was set to 10 W, and an etching time was set to 15 seconds. Then, the carbon film was removed by dry etching through an opening formed in the silicon film. As dry etching conditions, a flow rate of O$_2$ gas was set to 40 sccm, a pressure was set to 0.5 Pa, radio-frequency plasma power was set to 200 W, an RF bias was set to 50 W, and an etching time was set to 40 seconds.

In addition, the nickel film and the silicon film at the bottom of the concave portion were removed by an ion beam. As conditions of the ion beam, a flow rate of argon gas was set to 40 sccm, a pressure was set to 0.05 Pa, radio-frequency plasma power was set to 200 W, an acceleration voltage was 1,000 V, a drawing voltage was set to −500 V, and an etching time was set to 35 seconds. Then, the carbon film was removed by dry etching through an opening formed in the nickel film and the silicon film. As dry etching conditions, a flow rate of O$_2$ gas was set to 40 sccm, a pressure was set to 0.5

Pa, radio-frequency plasma power was set to 200 W, an RF bias was set to 50 W, and an etching time was set to 100 seconds.

Manufacturing and evaluation of the magnetic recording medium were performed in the same manner as Example 1 except for the above descriptions. Evaluation results thereof are shown in Table 2.

Example 30

In Example 30, as a mask layer, a Ni film of 20 nm and a Si film of 5 nm were formed in this order by a sputtering method. Then, a resist was applied on the silicon film by a spin coating method to form a resist layer having a layer thickness of 40 nm. In addition, as the resist, an epoxy-based, ultraviolet-curable resin was used. In addition, a glass stamp having a positive pattern of the magnetic recording patterns was used, and an ultraviolet ray having a wavelength of 365 nm was emitted from an upper side of the glass stamp of which the transmittance of ultraviolet ray is 95% or more for 10 seconds to cure the resist layer in a state in which the stamp was pressed on to the resist layer at a pressure of 1 MPa (approximately 10 kgf/cm$^2$). Then, the stamp was separated from the resist layer and irregularity patterns corresponding to the magnetic recording patterns were transferred on to the resist layer.

Next, the concave portion of the resist layer and the Si film under the concave portion were removed by dry etching. As conditions of the dry etching, a flow rate of $CF_4$ gas was set to 40 sccm, a pressure was set to 0.3 Pa, radio-frequency plasma power was set to 300 W, an RF bias was set to 10 W, and an etching time was set to 15 seconds. Then, the Ni film was removed by dry etching through an opening formed in the silicon film. As dry etching conditions, a flow rate of CO gas was set to 40 sccm, a pressure was set to 0.5 Pa, radio-frequency plasma power was set to 200 W, an RF bias was set to 50 W, and an etching time was set to 50 seconds.

Next, removal of the mask layer was performed. As processing conditions, a flow rate of gasified methanol that was used as a peeling gas was set to 40 sccm, a pressure was set to 0.5 Pa, radio-frequency plasma power was set to 600 W, a DC bias was set to 50 V, and an etching time was set to 50 seconds. Under these conditions, a surface of a magnetic layer of a convex portion was exposed, and the nickel film, the silicon film, and the resist film were removed.

Manufacturing and evaluation of the magnetic recording medium were performed in the same manner as Example 1 except for the above descriptions. Evaluation results thereof are shown in Table 2.

Examples 31 to 39

In Examples 31 to 39, as the mask layer 3, each mask material shown in Table 2 was used, and each mask layer was formed in each appropriate film thickness for each appropriate treatment time.

Manufacturing and evaluation of the magnetic recording medium were performed in the same manner as Example 30 except for the above descriptions. Evaluation results thereof are shown in Table 2.

Comparative Examples 1 to 3

In Comparative Examples 1 to 3, manufacturing and evaluation of the magnetic recording medium were performed in the same manner as Example 1 except that the peeling of the mask layer 3 was performed using an oxygen gas, a nitrogen gas, or a hydrogen gas. Evaluation results thereof are shown in Table 2.

Comparative Example 4

In Comparative Example 4, manufacturing and evaluation of the magnetic recording medium were performed in the same manner as Example 1 except that Mn was used for a second layer of the mask layer. Evaluation results thereof are shown in Table 2.

However, in Comparative Example 4, the mask layer disappeared, and thus it was difficult to perform pattern processing of the recording magnetic layer. Therefore, the subsequent manufacturing and evaluation were stopped.

Comparative Example 5

In Comparative Example 5, manufacturing and evaluation of the magnetic recording medium were performed in the same manner as Example 30 except that the removal of the mask layer was performed using a nitrogen gas.

However, in Comparative Example 5, after processing the recording magnetic layer, a reactive etching treatment using a nitrogen gas was performed, but the mask layer was not removed. Therefore, in Comparative Example 5, the subsequent manufacturing and evaluation were stopped.

Evaluation results thereof are shown in Table 2.

Example 40

In Example 40, first, a glass substrate (an outer size: 2.5 inches, manufactured by Konica Minolta Holdings, Inc.) after being washed was accommodated in a film-forming chamber of a DC magnetron sputtering device (C-3040, manufactured by Anelva Corporation), and the inside of the film-forming chamber was evacuated until the degree of vacuum reached $1 \times 10^{-5}$ Pa, and then an adhesion layer having a film thickness of 10 nm was formed on the glass substrate using a Cr target. Here, the glass substrate that was used had an outer diameter of 65 mm, an inner diameter of 20 mm, and average surface roughness (Ra) of 0.2 nm.

Next, an FeCoB film having a layer thickness of 60 nm as a soft magnetic layer, a Ru film having a layer thickness of 10 nm as an intermediate layer, and a 80Co-20Pt alloy film having a layer thickness of 10 nm as a recording magnetic layer were laminated in this order using a DC sputtering method.

Next, as a mask layer, a carbon film of 80 nm and a silicon film of 5 nm were formed on the recording magnetic layer in this order by a sputtering method.

Next, a resist was applied on the silicon film by a spin coating method to form a resist layer having a layer thickness of 40 nm. In addition, as the resist, an epoxy-based, ultraviolet-curable resin was used. In addition, a glass stamp having a positive pattern of the magnetic recording patterns was used, and an ultraviolet ray having a wavelength of 365 nm was emitted from an upper side of the glass stamp of which the transmittance of ultraviolet ray is 95% or more for 10 seconds to cure the resist layer in a state in which the stamp was pressed on to the resist layer at a pressure of 1 MPa (approximately 10 kgf/cm$^2$). Then, the stamp was separated from the resist layer and irregularity patterns corresponding to the magnetic recording patterns were transferred on to the resist layer.

In addition, the irregularity patterns that were transferred on to the resist layer corresponded to the magnetic recording patterns of 2 terabits (Tbpsi) per square inch, and thus tracks that were equally spaced along a circumference were formed, in which a convex portion of a data region had a cylinder (dot) shape with a diameter of 10 nm, and a distance between adjacent convexities in a circumferential direction was 17.96 nm. In addition, midway, 256 servo regions were provided to cross the tracks. The resist layer had a layer thickness of 55 nm at a convex portion and approximately 10 nm at a concave portion.

Next, the concave portion of the resist layer and the silicon film under the concave portion were removed by dry etching. As dry etching conditions at this time, a flow rate of $CF_4$ gas was set to 40 sccm, a pressure was set to 0.3 Pa, radio-frequency plasma power was set to 300 W, an RF bias was set to 10 W, and an etching time was set to 15 seconds. Then, the carbon film was removed by dry etching through an opening formed in the silicon film. As dry etching conditions, a flow rate of $O_2$ gas was set to 40 sccm, a pressure was set to 0.5 Pa, radio-frequency plasma power was set to 200 W, an RF bias was set to 50 W, and an etching time was set to 120 seconds.

Next, nitrogen ions ($N^+$) were implanted to a portion of the recording magnetic layer that was not covered with the mask layer. As ion implantation conditions, a flow rate of a nitrogen gas was set to 5 sccm, a pressure was set to 0.05 Pa, and implantation energy was set to 14 keV. The implantation was performed in such as manner that an ion implantation amount to the recording magnetic layer became $6\times10^{-16}$ atoms/cm$^2$.

Next, removal of the mask layer was performed. As processing conditions, a flow rate of gasified methanol that was used as a peeling gas was set to 40 sccm, a pressure was set to 0.5 Pa, radio-frequency plasma power was set to 600 W, a DC bias was set to 50 V, and an etching time was set to 200 seconds. As a result, a surface of a magnetic layer of a convex portion was exposed, and the carbon film, the silicon film, and the resist film were removed.

Next, a DLC film having a thickness of 4 nm was fowled using a CVD method, and a lubricant was applied in a thickness of 2 nm, whereby a magnetic recording medium was manufactured.

Electromagnetic conversion characteristics of the magnetic recording medium which was manufactured by the above-described method, were measured. Evaluation of the electromagnetic conversion characteristics was performed using a spin stand. At this time, in regard to evaluation heads, a vertical recording head was used as a recording head, and a TuMR head was used as a reading head.

A magnetic field was applied to the medium in advance in a direction orthogonal to the substrate using a dedicated erasing device having magnets at upper and lower sides of the substrate to perform DC erasing. This medium was allowed to rotate at 7,200 revolutions per minute, and it was confirmed that positioning might be correctly performed using the above-described head.

Then, a signal of a data region was read out, and Fourier transformation was performed using an oscilloscope. From this transformation, at a radius of 20 mm, a peak was obtained at 839.2 MHz. This is a frequency corresponding to a dot interval of 17.96 nm, and it could be seen that patterns were correctly formed with a specification of 2 Tbpsi. BER during recording of a signal in accordance with the frequency was measured. As a result, BER was 10 to the power of −8.5.

In addition, before and after removing the mask layer, confirmation of static magnetic characteristics (coercive force) was performed. With respect to evaluation of the static magnetic characteristics, a device using a Kerr effect was used. As a result, the coercive force before the removal was 5040 Oe, the coercive force after the removal was 5042 Oe, and a variation in the static magnetic characteristic before and after removing the mask layer was not observed.

In addition, an average height difference of the irregularity patterns of the recording magnetic layer was 2 nm. Furthermore, average surface roughness (Ra) of the recording magnetic layer was measured using an additional atomic force microscope (AFM), and 0.23 nm (a visual field of 1 μm square) was obtained.

Example 41

In Example 41, $C^+$ ions were implanted to a portion of the recording magnetic layer that was not covered with the mask layer. As ion implantation conditions, a flow rate of a methane gas was set to 10 sccm, a pressure was set to 0.05 Pa, and implantation energy was set to 6 keV. The implantation was performed in such as manner that an ion implantation amount to the recording magnetic layer became $3\times10^{-16}$ atoms/cm$^2$. Manufacturing and evaluation of the magnetic recording medium were performed in the same manner as Example 40 except for the above descriptions.

As a result, as shown in Table 2, BER was 10 to the power of −8.4. In addition, the coercive force before removing the mask was 5038 Oe, the coercive force after the removal was 5034 Oe, and a variation in the static magnetic characteristic before and after removing the mask was not observed. In addition, an average height difference of the irregularity patterns of the recording magnetic layer was 2 nm. Furthermore, average surface roughness (Ra) of the recording magnetic layer was measured using an additional atomic force microscope (AFM), and 0.21 nm (a visual field of 1 μm square) was obtained.

As described above, in Examples 1 to 41 that satisfy the conditions of the invention, since the mask layer that remains on the magnetic layer may be removed without causing magnetic damage to the magnetic layer, magnetic recording media having magnetic separation performance of the magnetic recording patterns which is superior to Comparative Examples 1 to 5 may be obtained. As a result, in the magnetic recording media of Examples 1 to 41, BER, which is more satisfactory than the magnetic recording media of Comparative Examples 1 to 5, was obtained.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

REFERENCE NUMERALS

1: Non-magnetic substrate
2: Magnetic layer
3: Mask layer
4: Resist layer
5: Non-magnetic layer
6: Protective layer
7: Lubricating film
MP: Magnetic recording pattern
30: Magnetic recording medium
31: Non-magnetic substrate
32: Soft-magnetic layer
33: Intermediate layer
34: Recording magnetic layer 34a: Magnetic recording pattern
35: Protective layer
36: Lubricating film
37: Non-magnetic layer
51: Rotary drive unit
52: Magnetic head
53: Head-driving unit
54: Recording and reproducing signal-processing system

What is claimed is:

1. A method of manufacturing a magnetic recording medium, the method comprising:
    forming a magnetic layer on a non-magnetic substrate;
    forming a mask layer on the magnetic layer;
    forming a resist layer which is patterned into a predetermined shape on the mask layer;
    patterning the mask layer into a shape corresponding to the resist layer using the resist layer;
    patterning the magnetic layer into a shape corresponding to the mask layer using the patterned mask layer; and
    removing the mask layer that remains on the magnetic layer by reactive plasma etching,
    wherein the reactive plasma etching is performed in an atmosphere containing an organic compound having at least one kind or plural kinds of functional groups selected from the group consisting of a hydroxyl group, a carbonyl group, a hydroxy carbonyl group, an alkoxy group, and an ether group.

2. The method of manufacturing a magnetic recording medium according to claim 1,
    wherein the mask layer is formed from a carbon film.

3. The method of manufacturing a magnetic recording medium according to claim 1,
    wherein the mask layer is formed from a metallic film of at least one kind selected from Ni, Fe, Co, and Cr, or an alloy film containing plural kinds thereof.

4. The method of manufacturing a magnetic recording medium according to claim 1,
    wherein the mask layer is formed from a resin film.

5. The method of manufacturing a magnetic recording medium according to claim 1,
    wherein the mask layer is formed from a laminated film in which a first layer formed from any one selected from a carbon film, a metallic film or an alloy film, and a resin film, and a second layer formed from a material having an etching rate lower than an etching rate of the first layer are laminated in this order.

6. The method of manufacturing a magnetic recording medium according to claim 5,
    wherein the second layer is fowled from a metallic film of at least one kind selected from Si, Al, Cr, Cu, Mo, W, Pt, Au, Ta, Ni, Fe, and Co, or an alloy film containing plural kinds thereof.

* * * * *